United States Patent
Hsieh et al.

(10) Patent No.: US 11,398,620 B2
(45) Date of Patent: Jul. 26, 2022

(54) ORGANIC LIGHT EMITTING TRANSISTORS INCLUDING ORGANIC SEMICONDUCTOR LAYERS WITH DIFFERENT LENGTHS AND WIDTHS

(71) Applicant: Hewlett-Packard Development Company, L.P., Spring, TX (US)

(72) Inventors: Hsing-Hung Hsieh, Taipei (TW); Super Liao, Taipei (TW); Kuan-Ting Wu, Taipei (TW)

(73) Assignee: Hewlett-Packard Development Company, L.P., Spring, TX (US)

(*) Notice: Subject to any disclaimer, the term of this patent is extended or adjusted under 35 U.S.C. 154(b) by 0 days.

(21) Appl. No.: 17/042,156

(22) PCT Filed: Nov. 16, 2018

(86) PCT No.: PCT/US2018/061661
§ 371 (c)(1),
(2) Date: Sep. 27, 2020

(87) PCT Pub. No.: WO2020/101713
PCT Pub. Date: May 22, 2020

(65) Prior Publication Data
US 2021/0265597 A1    Aug. 26, 2021

(51) Int. Cl.
*H01L 51/52*    (2006.01)
*H01L 51/10*    (2006.01)
(Continued)

(52) U.S. Cl.
CPC ........ *H01L 51/5296* (2013.01); *H01L 51/102* (2013.01); *H01L 51/5008* (2013.01); *H01L 51/56* (2013.01)

(58) Field of Classification Search
CPC .. H01L 51/5296; H01L 51/5008; H01L 51/56
See application file for complete search history.

(56) References Cited

U.S. PATENT DOCUMENTS 8,901,547 B2   12/2014   Facchetti
9,099,670 B2    8/2015   Facchetti
(Continued)

FOREIGN PATENT DOCUMENTS

EP            2911214        8/2015

OTHER PUBLICATIONS

Byoungchoo Park and Hideo Takezoe, "Enhanced luminescence in top-gate-type organic light-emitting transistors", Citation: Applied Physics Letters 85, 1280 (2004); doi: 10.10.
(Continued)

*Primary Examiner* — Anthony Ho
(74) *Attorney, Agent, or Firm* — HP Inc. Patent Department

(57) ABSTRACT

In some examples, an organic light emitting transistor (OLET) comprises a substrate layer; a gate electrode disposed on the substrate layer; and a dielectric layer disposed on the gate electrode. The OLET further comprises a first organic semiconductor layer (OSL) disposed on the dielectric layer; a second OSL disposed on the first OSL; a third OSL disposed on the second OSL; a drain electrode disposed on the third OSL; a first source electrode partially disposed on both the first OSL and the third OSL; and a second source electrode partially disposed on both the first OSL and the third OSL, wherein a length of the first OSL is larger than lengths of both the second and third OSLs, and wherein a width of the first OSL is smaller than widths of both the second and third OSLs.

15 Claims, 12 Drawing Sheets

(51) Int. Cl.
*H01L 51/50* (2006.01)
*H01L 51/56* (2006.01)

(56) References Cited

U.S. PATENT DOCUMENTS

| | | |
|---|---|---|
| 9,780,340 B2 | 10/2017 | Lee et al. |
| 2007/0228367 A1 | 10/2007 | Nakamura |
| 2013/0017518 A1 | 1/2013 | Kubilus et al. |
| 2015/0357603 A1 | 12/2015 | Kim et al. |

OTHER PUBLICATIONS

Congcong Zhang, Penglei Chen, and Wenping Hu, "Organic Light-Emitting Transistors: Materials, Device Confi Gurations, and Operations", 2016 Wiley-VCH Verlag GmbH & Co. KG.

ns as the p-type OSL 106 and the n-type OSL 118. Stated another way, the e-type OSL has dimensions that are substantially similar to the dimensions of the p-type and n-type OSLs.

ORGANIC LIGHT EMITTING TRANSISTORS INCLUDING ORGANIC SEMICONDUCTOR LAYERS WITH DIFFERENT LENGTHS AND WIDTHS

BACKGROUND

An organic light-emitting transistor (OLET) is a form of transistor that emits light. These transistors may be employed in digital displays. OLETs provide planar light sources that can be integrated in substrates like silicon, glass, and paper using standard microelectronic fabrication techniques. OLETs use organic semiconductors that are inherently different than inorganic semiconductors (e.g., silicon, gallium). The charge transport in organic semiconductors is attributed to a charge hopping process that occurs due to a π-conjugated aromatic molecular structure of the organic semiconductors. In contrast, charge transport in organic semiconductors is attributed to band-to-band transport. Further, organic semiconductors rely on charge injection from metal electrodes with suitable work functions, unlike inorganic semiconductors, where charge carriers are present either intrinsically or by virtue of doping.

BRIEF DESCRIPTION OF THE DRAWINGS

Various examples will be described below referring to the following figures.

DETAILED DESCRIPTION

Figure 1:
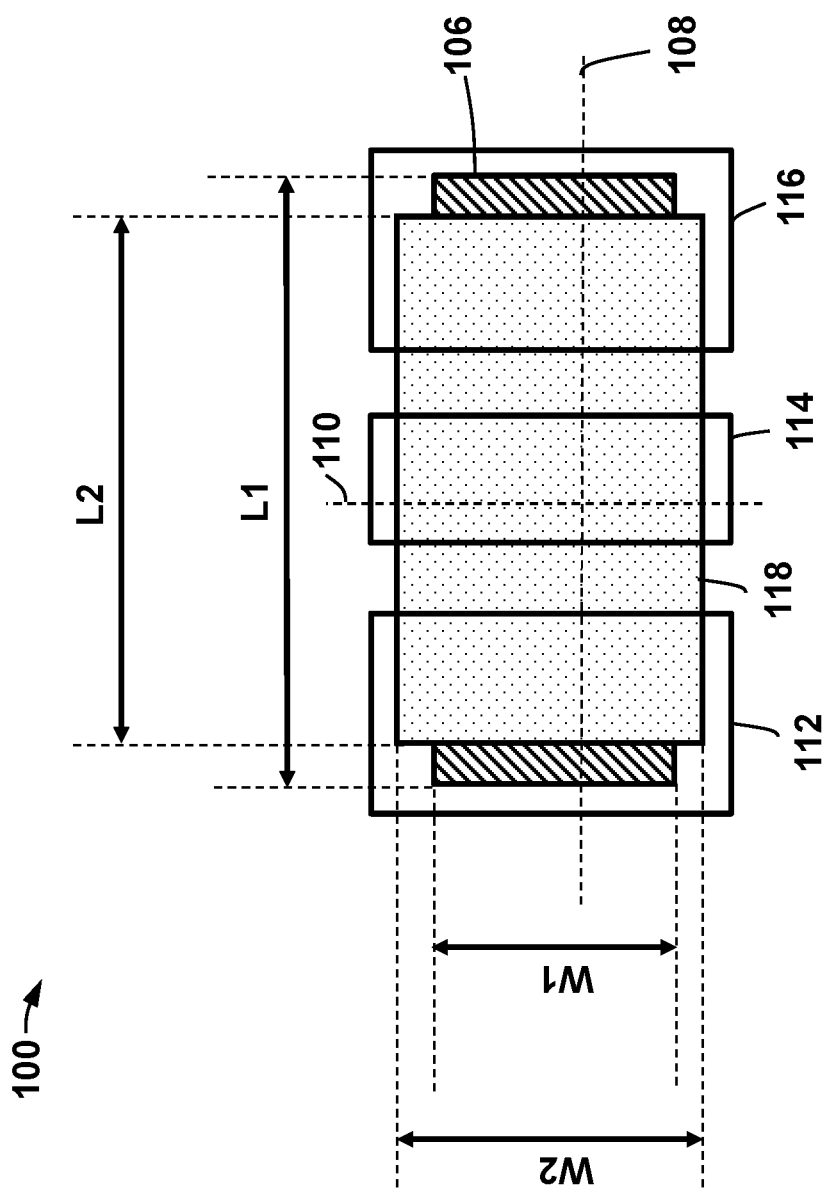
FIG. 1 depicts a top-down view of an illustrative organic light-emitting transistor (OLET) implementing a modified tri-layer architecture, in accordance with various examples.

Organic light emitting transistors (OLETs) are up and coming luminescent devices. OLETs include an organic semiconductor layer (also referred to as an "active layer"). OLETs also include source, drain, and gate electrodes. When a voltage higher than a threshold voltage is applied to the gate terminal, the OLET turns on. During this turn on time, if a suitable source voltage is applied to the source electrode, it injects holes into the active layer; and if a suitable drain voltage is applied to the drain electrode, it injects electrons into the active layer. These electrons and holes recombine and release energy in the form of photons. The architecture of OLETs may be characterized by the number of active layers used. In some cases, OLETs have tri-layer architecture, meaning that they include three organic semiconductor layers, which may include an n-type organic semiconductor layer, an e-type (emitting-type) organic semiconductor layer, and a p-type organic semiconductor layer. These organic semiconductor layers have substantially similar dimensions (e.g., lengths, widths). As used herein, substantially similar dimensions mean that the dimensions, such as lengths and widths of the active layers, are within +/−10 percent of one another.

In the tri-layer architecture, these charges (electrons and holes) recombine in the e-type organic semiconductor layer and release photons. The electrons transport from the drain electrode to the e-type organic semiconductor layer via the n-type organic semiconductor layer and the holes transport from the source electrode(s) to the e-type organic semiconductor layer via the p-type organic semiconductor layer. The tri-layer architecture, including organic semiconductor layers having substantially similar dimensions, has several issues. First, this architecture has quantum efficiency of less than 5%, which is highly-undesirable; second, this architecture—because of the presence of vertical contacts between the source electrodes and p-type organic semiconductor layer—results in a large contact resistance between the source electrodes and the p-type organic semiconductor layer (OSL), which necessitates a large driving voltage; and third, this architecture has a higher probability of producing high leakage currents because the active layers of this tri-layer architecture are fabricated using a single shadow mask (meaning that the same shadow mask is used to deposit the three active layers), and during fabrication, even a slight misalignment of the shadow mask may result in the p-type OSL and n-type OSL to come in contact with one another, which results in high leakage currents. Therefore, modifications to the current tri-layer architecture are needed to mitigate the issues mentioned above.

Accordingly, the present disclosure presents an OLET implementing a modified tri-layer architecture, which mitigates the issues mentioned above. In some examples, the modified tri-layer architecture includes n-type, e-type, and p-type organic semiconductor layers, where at least two of the three organic semiconductor layers assume different dimensions (e.g., lengths and widths). In some examples, the n-type and e-type organic semiconductor layers may assume the same dimensions and the p-type organic semiconductor layer may have different dimensions (e.g., lengths and widths) than the other two active layers (n-type and e-type). In other examples, the three active layers assume different dimensions (e.g., lengths and widths). Employing such a modified architecture improves the contact area of the source electrodes with the active layers, and thereby reduces the driving voltage (as the contact resistance decreases). Further, because of the different dimensions of the active layers, the modified tri-layer architecture may be fabricated using different shadow masks, which eliminates the mask misalignment issue and further reduces leakage currents.

FIG. 1 depicts a top-down view 100 of an illustrative OLET implementing a modified tri-layer architecture, which includes organic semiconductor layers having different dimensions. The top-down view 100 shows a p-type organic semiconductor layer 106 that has a length L1 and a width W1. The top-down view 100 also depicts an n-type OSL 118 that is positioned above the p-type OSL 106. The n-type OSL 118 has a length L2 and a width W2, which is different from the length L1 and width W1, respectively. The illustrative OLET depicted in FIG. 1 also includes an e-type OSL, which is not explicitly visible from the top-down view 100 because the e-type OSL has substantially similar dimensions as the n-type OSL 118 and is positioned above the p-type OSL 106. Stated another way, the e-type OSL is positioned between the p-type OSL 106 and the n-type OSL 118 and has the length L2 and width W2. The top-down view 100 further shows source electrodes 112, 116, and a drain electrode 114. The position of the source electrodes 112, 116, and the drain electrode 114 with respect to the above-mentioned three OSL layers is readily observable in a cross-sectional side-view 200 (FIG. 2(*a*)). Other layers (e.g., substrate, gate electrode, e-type OSL) that are not explicitly visible in the top-down view 100 are also observable in the cross-sectional side-view 200.

Figure 2A:
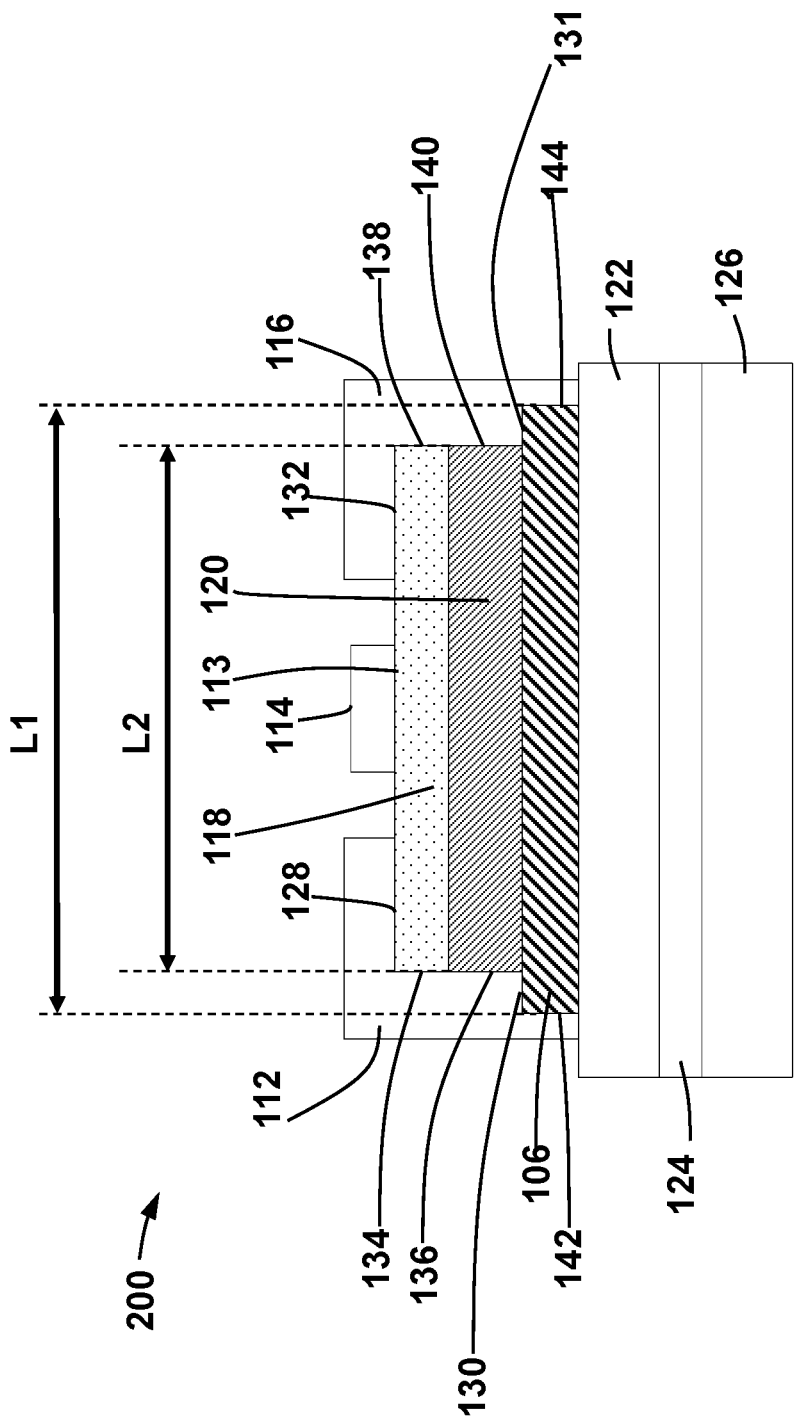
FIG. 2(a) depicts a cross-sectional side-view of the illustrative OLET of FIG. 1, in accordance with various examples.
Figure 2B:
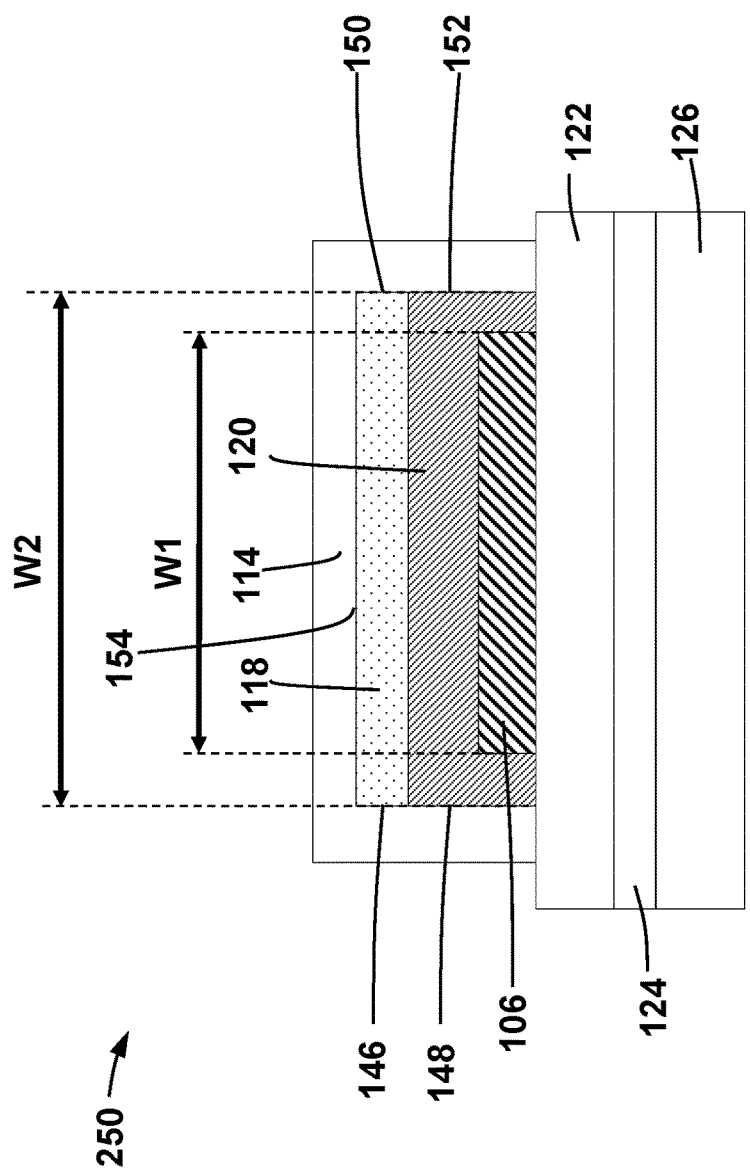
FIG. 2(b) depicts another cross-sectional side-view of the illustrative OLET of FIG. 1, in accordance with various examples.

Refer now to FIG. 2(*a*), which depicts the cross-sectional side-view 200 of the illustrative OLET of FIG. 1. The cross-sectional side-view 200 depicts a side view of the modified tri-layer architecture when a cut is made along a line 108 (FIG. 1) to the top-down view 100. The cross-sectional side-view 200 depicts a substrate layer 126, a gate electrode 124, a dielectric layer 122, the p-type OSL 106, the e-type OSL 120, the n-type OSL 118, source electrodes 112, 116, and the drain electrode 114. In some examples, the gate electrode 124 is disposed on the substrate layer 126; the dielectric layer 122 is disposed on the gate electrode 124; the p-type OSL 106 is disposed on the dielectric layer 122; the e-type OSL 120 is disposed on the p-type OSL 106; and the n-type OSL 118 is disposed on the e-type OSL 120.

As noted above in FIG. 1, the p-type OSL 106 that has a length L1, the n-type OSL 118 has a length L2, where both lengths L1 and L2 are different. In some examples, the length L1 is larger than the length L2. The cross-sectional side-view 200 of the modified tri-layer architecture depicted in FIG. 2(*a*) also includes the e-type OSL 120 that has at least one substantially similar dimension as the n-type OSL 118. In the examples of FIG. 2(*a*), the lengths of the e-type OSL 120 and the n-type OSL 118 are substantially similar. Stated another way, the length of the p-type OSL 106 is different than lengths of both the e-type and n-type OSLs 120, 118, respectively. In some examples, the length L1 can be 100 μm or above and the length L2 can be 80 μm or above.

In some examples, the drain electrode 114 is disposed on the n-type OSL 118 and forms a horizontal contact 113 with the n-type OSL 118. As is described below, having different lengths facilitates forming horizontal contacts, which, in some examples, reduces the driving voltage. In some examples, source electrodes 112, 116 are partially disposed on both the n-type OSL 118 and the p-type OSL 106. For example, a portion of the source electrode 112 is horizontally positioned on the n-type OSL 118 and forms a horizontal contact 128 with the n-type OSL 118, and another portion of the source electrode 112 is horizontally positioned on the p-type OSL 106 and forms a horizontal contact 130 with the p-type OSL 106. Similarly, a portion of the source electrode 116 is horizontally positioned on the n-type OSL 118 and forms a horizontal contact 132 with the n-type OSL 118, and another portion of the source electrode 116 is horizontally positioned on the p-type OSL 106 and forms a horizontal contact 131 with the p-type OSL 106. FIG. 2(*a*) also depicts the source electrodes 112, 116 forming horizontal contacts (not expressly marked in FIG. 2(*a*)) with the dielectric layer 122.

In addition to the horizontal contacts, the source electrode 112 forms vertical contacts 134, 136, and 142 with the n-type OSL 118, e-type OSL 120, and p-type OSL, respectively. Similarly, the source electrode 116 forms vertical contacts 138, 140, and 144 with the n-type OSL 118, e-type OSL 120, and p-type OSL 106, respectively. Horizontal contacts form a low-resistance contact relative to vertical contacts. Thus, these horizontal contacts 130, 131 between the source electrodes 112, 116 and p-type OSL 106 increase the contact area between the source electrodes 112, 116 and the p-type OSL 106 and result in a low contact resistance between them (relative to just having vertical contact 142, 144). This low contact resistance necessitates a relatively low driving voltage, meaning that the holes experience less resistance while entering into the p-type OSL 106.

Refer briefly to FIG. 2(*b*), which depicts a cross-sectional side-view 250 of the illustrative OLET of FIG. 1. The cross-sectional side-view 250 shows a side view of the modified tri-layer architecture along a cut that is made along a line 110 (FIG. 1) to the top-down view 100. The cross-sectional side-view 250, similar to the cross-sectional side-view 200, shows the substrate layer 126, the gate electrode 124, and the dielectric layer 122. Similar to the cross-sectional side-view 200, the cross-sectional side-view 250 depicts the n-type OSL 118, p-type OSL 106, and e-type OSL 120. The widths of the OSL layers are clearly observable in the cross-sectional side-view 250. The width of the p-type OSL 106 is W1 and the widths of the n-type and e-type OSLs 118, 120, respectively, are substantially similar. In the example shown in FIG. 2(*b*), the width W1 is smaller than the W2. In some examples, the width W1 can be 20 μm or above and the width W2 can be 40 μm or above. The cross-sectional side 250 further depicts the drain electrode 114 that forms a horizontal contact 154 with the n-type OSL 118. The drain electrode 114 also forms vertical contacts 146, 150 with the n-type OSL 118, and the drain electrode 114 forms vertical contacts 148, 152 with the e-type OSL 120. Since the p-type OSL 106 has a width (W1) smaller than the widths of n-type and e-type OSLs 118, 120, respectively, the drain electrode 114 doesn't contact the p-type OSL 106, which decreases the electrons injected by the drain electrode 114 entering p-type OSL 106 and thus reduces leakage current.

Now referring to both FIGS. 2(*a*) and 2(*b*), in some examples, the substrate layer 126 may include silicon. In other examples, the substrate layer 126 may include glass or plastic. In some examples, the dielectric layer 122 may include silicon dioxide or an insulating polymer; the p-type OSL 106 may include triphenylamine and derivatives; the n-type OSL 118 may include Tris(8-hydroxyquinolinato) aluminium ($Alq_3$) or Oligo-thiophene; and the e-type OSL 120 may include $Alq_3$, or other host-dopant emissive materials. In some examples, the source electrodes 112, 116, the gate electrode 124, and the drain electrode 114 include metal materials such as gold (Au) or other conductive materials such as indium tin oxide (ITO).

Refer now to the operation of the OLET implementing the modified architecture of FIG. 1. In operation, when a voltage higher (e.g., −20V) than a threshold voltage (e.g., −5V) is applied to the gate electrode 124, the OLET implementing the modified tri-layer architecture turns on. During this turn on time, if a suitable source voltage (e.g., 0V) is applied to the source electrodes 112, 116, it injects holes into the p-type OSL 106; and if a suitable drain voltage (e.g., −20V) is applied to the drain electrode 114, it injects electrons into the n-type OSL 118. These electrons and holes transport via the n-type OSL 118 and the p-type OSL 106, respectively, and recombine in the e-type OSL 120 and release energy in the form of photons.

As noted above, one of the issues with the previously used architecture having active layers with similar dimensions was a leakage current that emerges due to the misalignment of the single shadow mask that was used to fabricate the active layers. The previously employed architecture deposits active layers using the same shadow mask, with the layers subsequently forming one after another. In some cases, when depositing one active layer after another, even a slight misalignment (e.g., 0.1 µm) of the shadow mask may deposit some of the subsequently deposited active layer on the previously deposited active layer. This undue deposition of two active layers generates undesired leakage currents. However, having different dimensions necessitates the use of different masks and, as described in this disclosure, may reduce the leakage current flowing due to the single shadow mask misalignment issue. For example, one mask may be used to deposit the p-type OSL layer 106 and a second mask may be used to deposit both the e-type and n-type OSLs 120, 118, respectively. Using two separate masks may resolve the misalignment issue that arises while using a single shadow mask.

In some examples, the misalignment issue of the shadow mask can be further avoided by having a modified tri-layer architecture with the active layers having different dimensions. An example of such a modified tri-layer architecture is depicted in FIGS. 3, 4(a), and 4(b).

Figure 3:
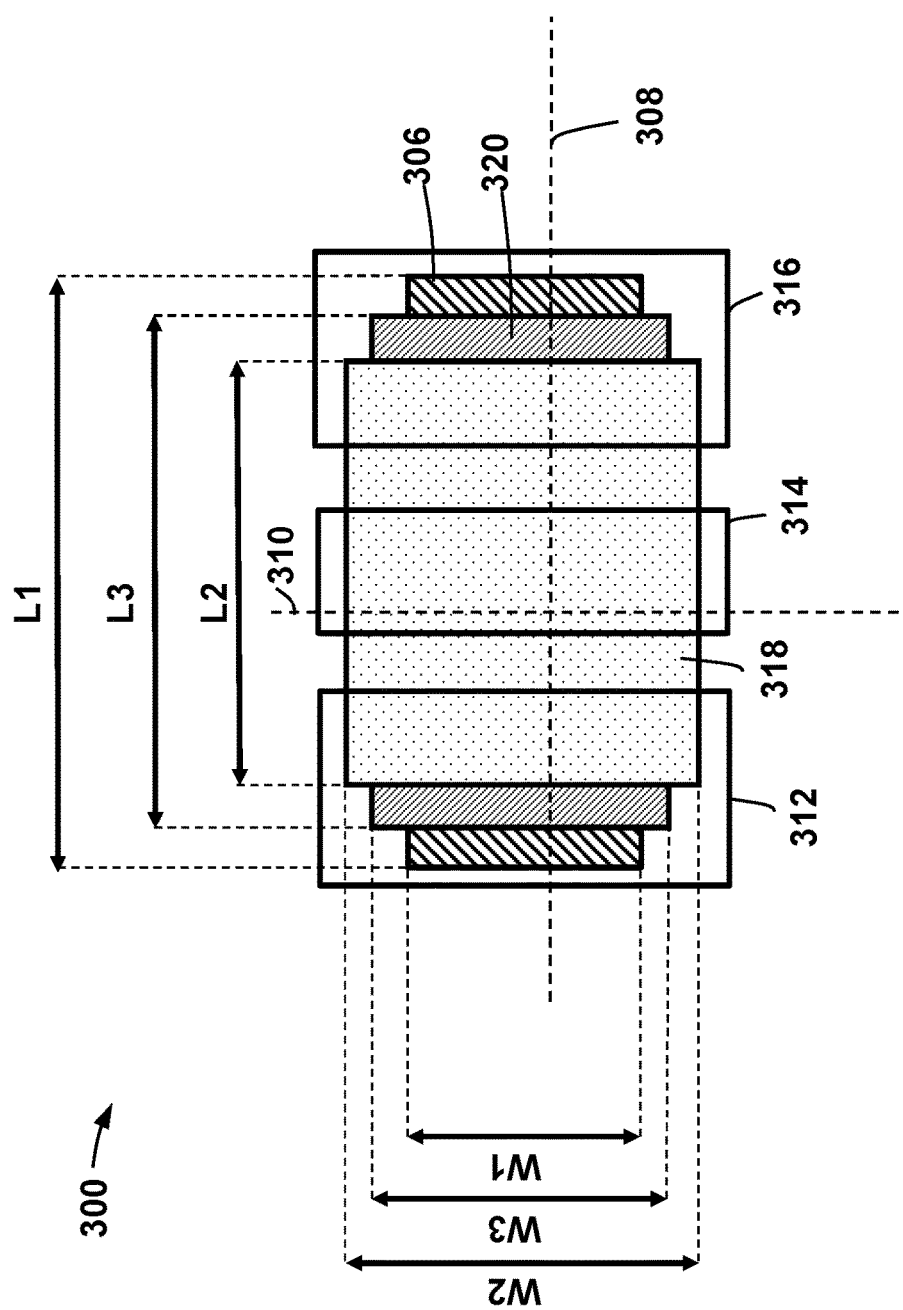
FIG. 3 depicts an illustrative top-down view of another illustrative OLET implementing the modified tri-layer architecture, in accordance with various examples.

FIG. 3 depicts an illustrative top-down view 300 of an OLET implementing the modified tri-layer architecture with the active layers having different dimensions. The top-down view 300 depicts a p-type organic semiconductor layer 306 that has a length L1 and a width W1. The top-down view 300 also depicts an n-type OSL 318 that is positioned above the p-type OSL 306. The n-type OSL 318 has a length L2 and a width W2, which is different (e.g., L2 is smaller and L1 and W2 is larger than W1) from the length L1 and width W1, respectively. The illustrative OLET depicted in FIG. 3 also includes an e-type OSL 320, which is explicitly visible from the top-down view 300 because the e-type OSL 320 has different dimensions than the p-type OSL 306 and the n-type OSL 318. In the example depicted in FIG. 3, the e-type OSL 320 is positioned between the p-type OSL 306 and the n-type OSL 318 and has a length L3 and a width W3, which are different from the lengths and widths of both the p-type OSL 306 and the n-type OSL 318. The top-down view 300 further shows source electrodes 312, 316, and a drain electrode 314. The position of the source electrodes 312, 316, and the drain electrode 314 with respect to the three OSL layers 306, 318, and 320 is readily observable in a cross-sectional view 400 (FIG. 4(a)).

Figure 4A:
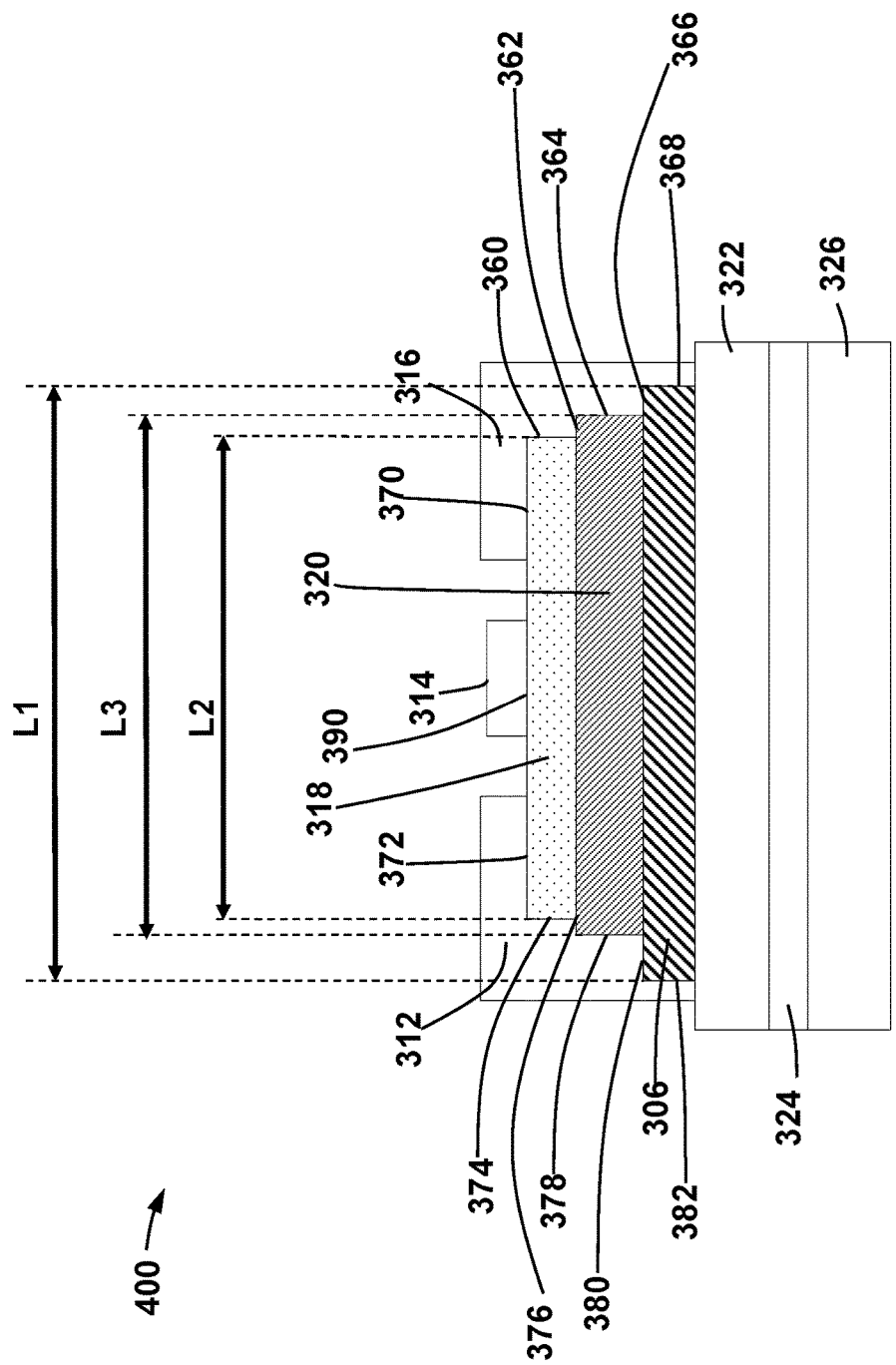
FIG. 4(a) depicts a cross-sectional side-view of the illustrative OLET of FIG. 3, in accordance with various examples.
Figure 4B:
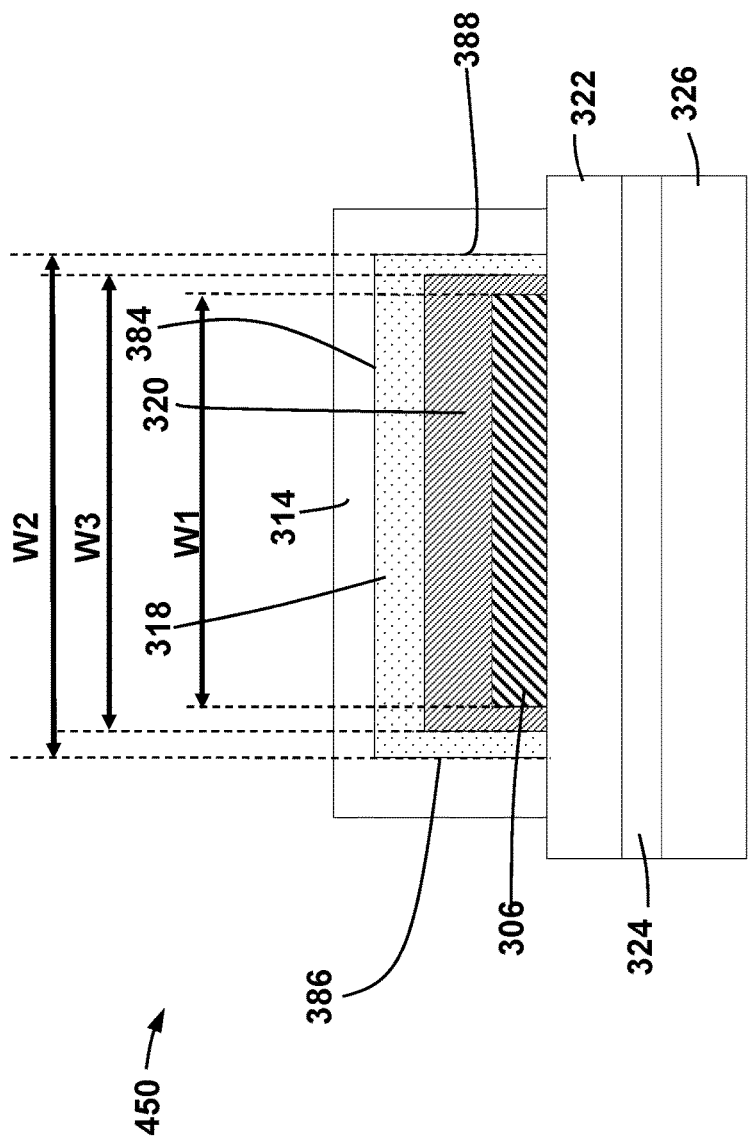
FIG. 4(b) depicts a cross-sectional side-view of the illustrative OLET of FIG. 3, in accordance with various examples.

Refer now to FIG. 4(a), which depicts the cross-sectional side-view 400 of the illustrative OLET of FIG. 3. The cross-sectional side-view 400 depicts a side view of the modified tri-layer architecture when a cut is made along a line 308 (FIG. 3) to the top-down view 300. The cross-sectional side-view 400 depicts a substrate layer 326, a gate electrode 324, a dielectric layer 322, p-type OSL 306, e-type OSL 320, n-type OSL 318, source electrodes 312, 316, and drain electrode 314. In some examples, the gate electrode 324 is disposed on the substrate layer 326; the dielectric layer 322 is disposed on the gate electrode 324; the p-type OSL 306 is disposed on the dielectric layer 322; the e-type OSL 320 is disposed on the p-type OSL 306; the n-type OSL 318 is disposed on the e-type OSL 320.

As noted above in FIG. 3, the p-type OSL 306 that has a length L1; the n-type OSL 318 has a length L2; and the e-type OSL 320 has a length L3, where the lengths L1, L2, and L3 are different. In some examples, the length L1 is larger than the length L3, which is larger than the length L2. In some examples, the length L1 can be 120 µm or above; the length L2 can be 80 µm or above; and the length L3 can be 100 µm or above.

As is described below, having different OSL lengths facilitates forming horizontal contacts, which, in some examples, reduces the driving voltage. Due to this difference in OSL lengths, in some examples, source electrodes 312, 316 partially dispose on n-type, p-type, and e-type OSLs 318, 306, and 320. For example, a portion of the source electrode 312 is horizontally positioned on the n-type OSL 318 and forms a horizontal contact 372 with the n-type OSL 318; another portion of the source electrode 312 is horizontally positioned on the e-type OSL 320 and forms a horizontal contact 376 with the e-type OSL 320; and yet another portion of the source electrode 312 is horizontally positioned on the p-type OSL 306 and forms a horizontal contact 380 with the p-type OSL 306. Similarly, a portion of the source electrode 316 is horizontally positioned on the n-type OSL 318 and forms a horizontal contact 370 with the n-type OSL 318; another portion of the source electrode 316 is horizontally positioned on the e-type OSL 320 and forms a horizontal contact 362 with the e-type OSL 320; yet another portion of the source electrode 316 is horizontally positioned on the p-type OSL 306 and forms a horizontal contact 366 with the p-type OSL 306. FIG. 2(a) also depicts the source electrodes 312, 316 forming horizontal contacts (not expressly marked in FIG. 2(a)) with the dielectric layer 322. In some examples, the drain electrode 314 is disposed on the n-type OSL 118 and forms a horizontal contact 390 with the n-type OSL 318.

In addition to the horizontal contacts described above, the source electrode 312 forms vertical contacts 374, 378, and 382 with the n-type OSL 318, e-type OSL 320, and p-type OSL 306, respectively. Similarly, the source electrode 316 forms vertical contacts 360, 364, and 368 with the n-type OSL 318, e-type OSL 320, and p-type OSL 306, respectively. As noted above in FIG. 2(a), horizontal contacts form a low-resistance contact relative to vertical contacts. Thus, these horizontal contacts 380, 366 between the source electrodes 312, 316 and p-type OSL 306 result in a low contact resistance between the source electrodes 312, 316 and the p-type OSL 306 (relative to just having vertical contacts 382, 368). The contact resistance decreases as the contact area between the source electrodes 312, 316 and the p-type OSL 306 increases. This low contact resistance necessitates a relatively low driving voltage, meaning that the holes experience less resistance while entering into the p-type OSL 306.

Refer briefly to FIG. 4(b), which depicts a cross-sectional side-view 450 of the illustrative OLET of FIG. 3. The cross-sectional side-view 450 shows a side view of the modified tri-layer architecture along a cut that is made along a line 310 (FIG. 3). The cross-sectional side-view 450, similar to the cross-sectional side-view 400, shows the substrate layer 326, the gate electrode 324, and the dielectric layer 322. Similar to the cross-sectional side-view 400, the cross-sectional side-view 450 depicts the n-type OSL 318, p-type OSL 306, and e-type OSL 320. The widths of the OSL layers are clearly observable in the cross-sectional side-view 450. The width of the p-type OSL 306 is W1; the width of the n-type OSL 318 is W2; and the width of the e-type OSL 320 is W3. In the example shown in FIG. 4(b), the width W1 is smaller than the width W3, which is smaller than the width W2. In some examples, the width W1 can be 20 µm or above; the width W2 can be 60 µm or above; and the width W3 can be 40 µm or above. The cross-sectional side 450 further depicts the drain electrode 314 that forms a horizontal contact 384 with the n-type OSL 318. The drain electrode 314 also forms vertical contacts 386, 388 with the n-type OSL 318. Due to the difference in widths, the drain electrode 314 doesn't contact the p-type OSL 306, which decreases the electrons injected by the drain electrode 314 entering p-type OSL 306 and thus reduces leakage current.

Figure 5:
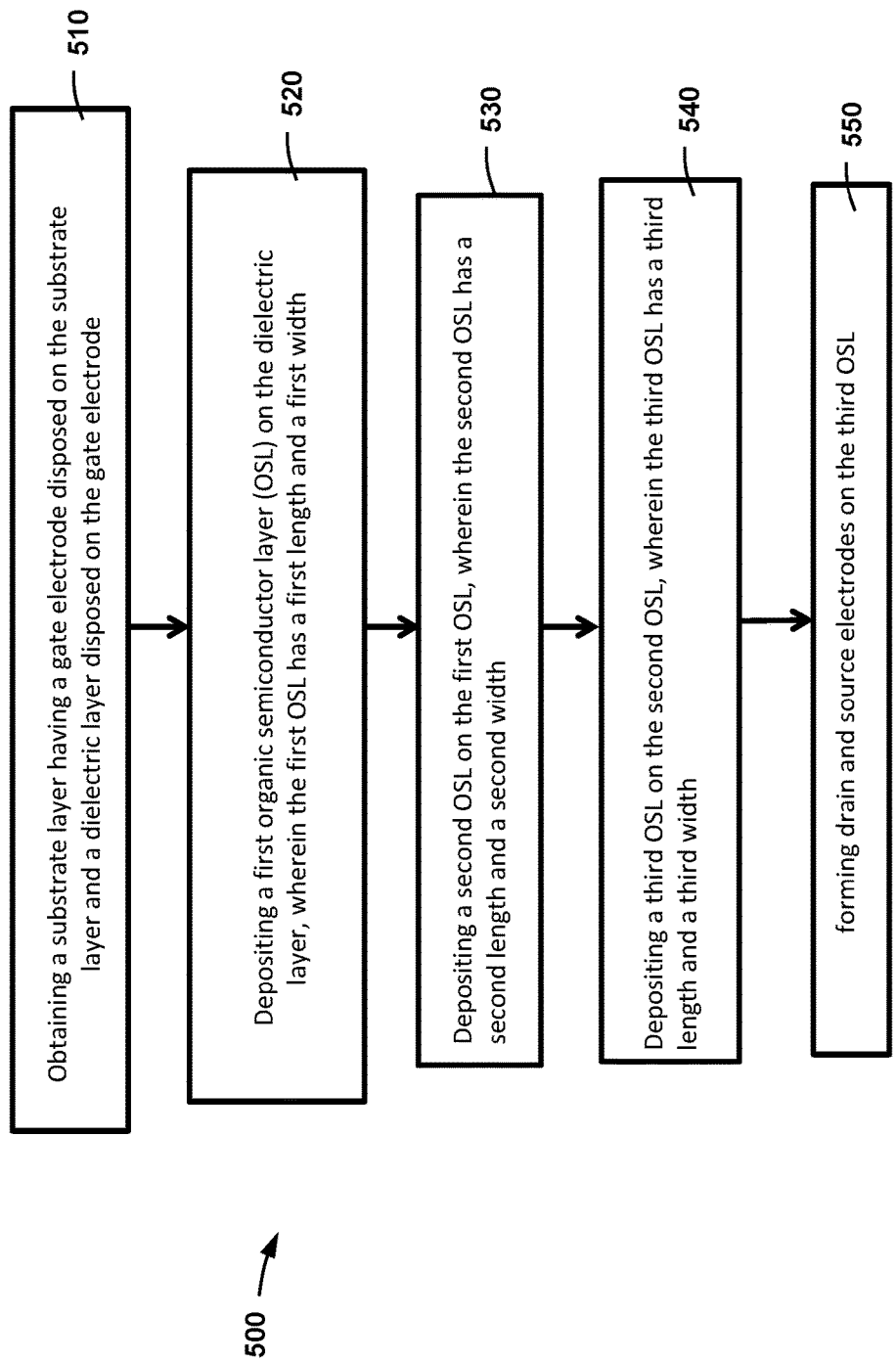
FIG. 5 depicts an illustrative method to fabricate an OLET with the modified tri-layer architecture, in accordance with various examples.
Figure 6A:
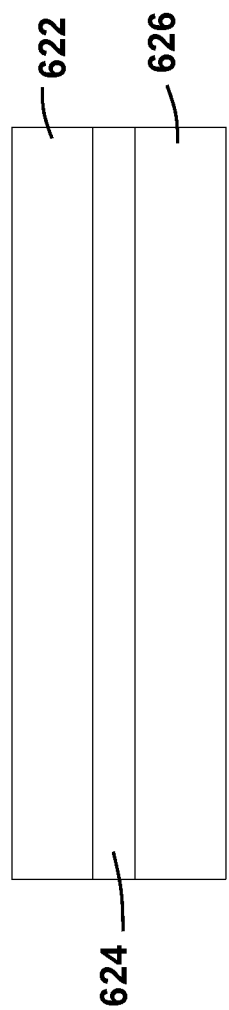
FIGS. 6(a)-6(e) depict sequential fabrication diagrams of the OLET, in accordance with various examples
Figure 6B:
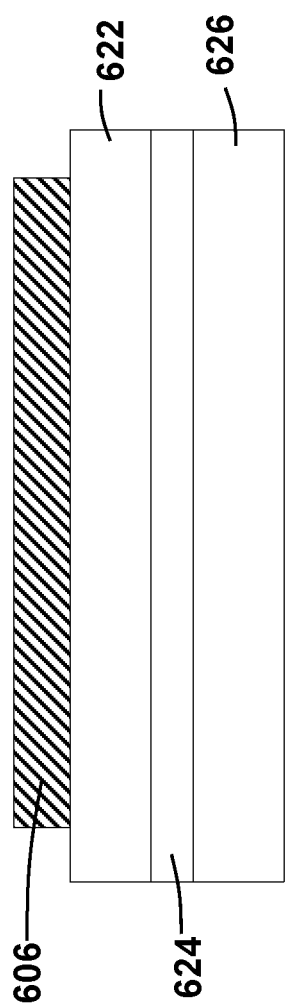
Figure 6C:
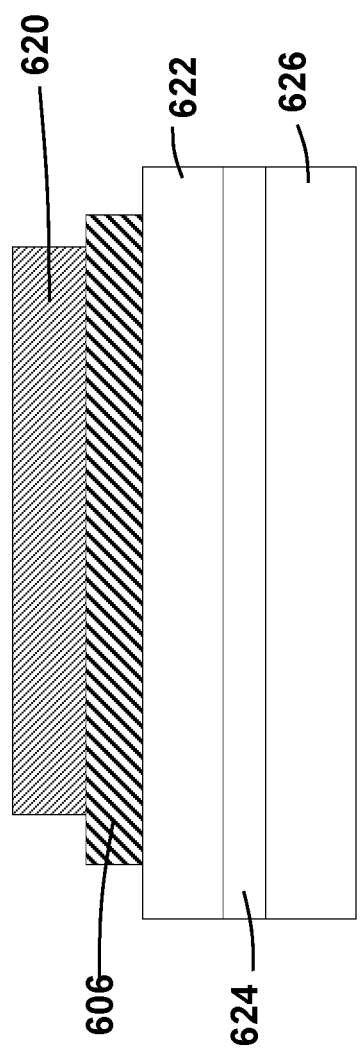
Figure 6D:
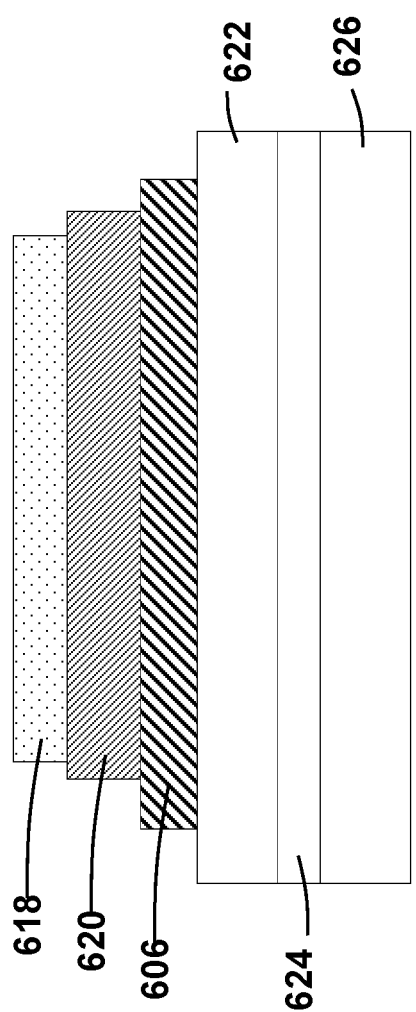
Figure 6E:
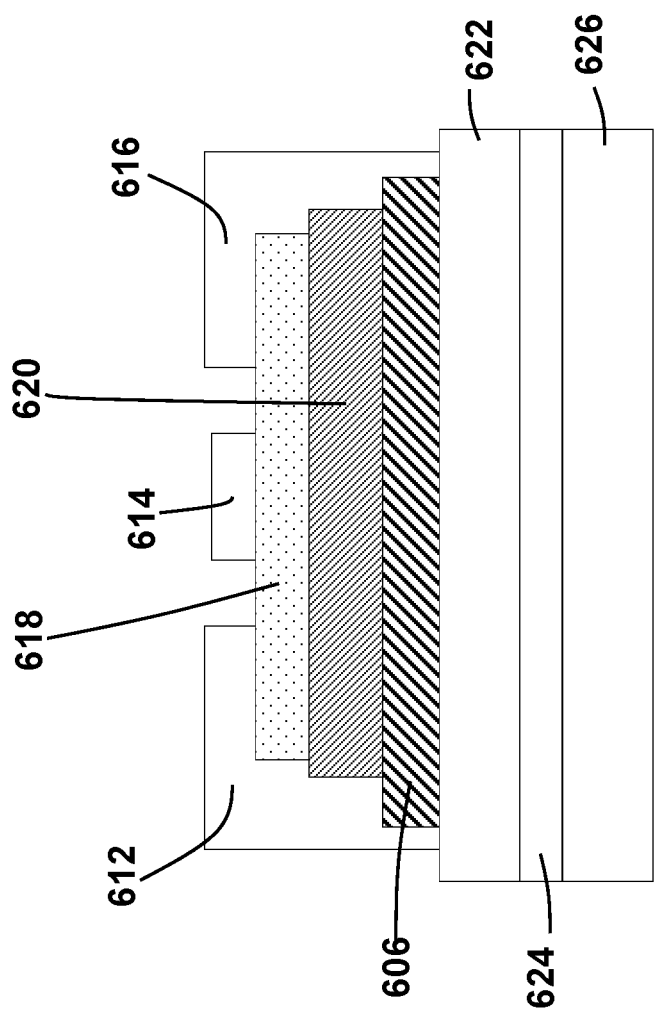

Now referring to FIG. 5, an illustrative method 500 that may be employed to fabricate an OLET with the modified tri-layer architecture is shown. The method 500 describes the fabrication method of the OLET having active layers with different dimensions. The method 500 is now described in tandem with FIGS. 6(a)-6(e), which depict sequential fabrication diagrams of the OLET. The method 500 begins with a block 510 that includes obtaining a substrate layer 626 having a gate electrode 624 disposed on the substrate layer 626, and a dielectric layer 622 disposed on the gate electrode 624 (FIG. 6(a)). The structure may be obtained in an evaporation chamber (e.g., thermal evaporation chamber) where the subsequent layers will be deposited. At this point, the chamber is vacuumed with a pressure of, for example, below $5 \times 10^{-6}$ Torr. The materials are processed under vacuum to avoid oxidation of materials at their melting temperatures. In some examples, pumps are used to create the vacuum. The evaporation chamber also includes materials that will be evaporated to form the multiple active layers.

The method 500 then proceeds to a block 520 that includes depositing a first OSL 606 on the dielectric layer 622, where the first OSL 606 has a first length and a first width. The deposition of the first OSL 606 may be performed using a first mask and by evaporating triphenylamine at 280° C. (FIG. 6(b)). Following the block 520, the method 500 proceeds to the block 530 that includes depositing a second OSL 620 on the first OSL 606, where the second OSL 620 has a second length and a second width (FIG. 6(c)). The deposition of the second OSL 620 may be performed using a second mask and by evaporating $Alq_3$ at 415° C. As described above in FIGS. 4(a)-4(b), in some examples, the second length is smaller than the first length, and the second width larger than the first width. The method 500 then proceeds to block 540 that includes depositing a third OSL 618 on the second OSL 620, where the third OSL 618 has a third length and a third width (FIG. 6(d)). The deposition of the third OSL 618 may be performed using a third mask and by evaporating oligo-thiophene at 300° C. As described above in FIGS. 4(a)-4(b), in some examples, the second length is larger than the third length and the second width is smaller than the third width. The method 500 then proceeds with a block 550 that includes forming drain electrode 614 on the third OSL (FIG. 6(e)) and source electrodes 612, 614 partially disposed on the first OSL 606, second OSL 620, and the third OSL 618 (FIG. 6(e)). These electrodes are formed by evaporating a metal, such as gold, for example, at 1000° C., onto a mask.

The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications. Unless otherwise stated, "about," "approximately," or "substantially" preceding a value means +/−10 percent of the stated value.

What is claimed is:

1. An organic light emitting transistor (OLET), comprising:
    a substrate layer;
    a gate electrode disposed on the substrate layer;
    a dielectric layer disposed on the gate electrode;
    a first organic semiconductor layer (OSL) disposed on the dielectric layer;
    a second OSL disposed on the first OSL;
    a third OSL disposed on the second OSL;
    a drain electrode disposed on the third OSL;
    a first source electrode partially disposed on both the first OSL and the third OSL; and
    a second source electrode partially disposed on both the first OSL and the third OSL,
    wherein a length of the first OSL is larger than lengths of both the second and third OSLs, and wherein a width of the first OSL is smaller than widths of both the second and third OSLs.

2. The OLET of claim 1, wherein the lengths of both the second and third OSLs are substantially similar, and wherein the widths of both the second and third OSLs are substantially similar.

3. The OLET of claim 1, wherein the length of the second OSL is larger than the length of the third OSL, and wherein the width of the second OSL is smaller than the width of the third OSL.

4. The OLET of claim 1, wherein the first and second source electrodes are to generate holes into the first OSL and the drain electrode is to generate electrons into the third OSL, and wherein the electrons and holes are to combine in the second OSL to generate photons.

5. The OLET of claim 1, wherein the first OSL is a p-type organic semiconductor layer, the second OSL is an e-type organic semiconductor layer, and the third OSL is an n-type organic semiconductor layer.

6. The OLET of claim 1, wherein both the first and second source electrodes form horizontal contacts with the first OSL.

7. A method of fabricating an organic light emitting transistor (OLET), comprising:
    obtaining a substrate layer having a gate electrode disposed on the substrate layer and a dielectric layer disposed on the gate electrode;
    depositing a first organic semiconductor layer (OSL) on the dielectric layer, wherein the first OSL has a first length and a first width;
    depositing a second OSL on the first OSL, wherein the second OSL has a second length and a second width;
    depositing a third OSL on the second OSL, wherein the third OSL has a third length and a third width; and
    forming drain and source electrodes,
    wherein the drain electrode is positioned on the third OSL and the source electrodes are positioned on both the first and third OSL, and the first length is larger than the second and the third lengths, and wherein the first width is smaller than the second and third widths.

8. The method of claim 7, wherein the second length is larger than the third length and the second width is smaller than the third width.

9. The method of claim 7, wherein the second length is substantially similar to the third length and the second width is substantially similar to the third width.

10. The method of claim 7, further comprising depositing the first OSL using a first mask, depositing the second OSL using a second mask, and depositing the third OSL using a third mask, wherein the first, second, and third masks are different from each other.

11. An organic light emitting transistor (OLET), comprising:
    a substrate layer;
    a gate electrode disposed on the substrate layer;
    a dielectric layer disposed on the gate electrode;

a first organic semiconductor layer (OSL) disposed on the dielectric layer, wherein the first OSL has a first length and a first width;

a second OSL disposed on the first OSL, wherein the second OSL has a second length and a second width;

a third OSL disposed on the second OSL, wherein the third OSL has a third length and a third width;

a drain electrode disposed on the third OSL; and a first source electrode disposed on the first, second, and third OSLs;

a second source electrode disposed on the first, second, and third OSLs, wherein the first length is larger than second length, and the second length is larger than the third length, wherein the first width is smaller than the second width, and the second width is smaller than the third width.

12. The OLET of claim 11, wherein both the first and second source electrodes form horizontal contacts with the first OSL.

13. The OLET of claim 11, wherein the first source electrode forms horizontal contacts with the first, second, and third OSLs, wherein the second source electrode forms horizontal contacts with the first, second, and third OSLs.

14. The OLET of claim 11, wherein the first and second source electrodes are to generate holes into the first OSL and the drain electrode is to generate electrons into the third OSL, and wherein the electrons and holes are to combine in the second OSL to generate photons.

15. The OLET of claim 11, wherein the first OSL is a p-type OSL, the second OSL is an e-type OSL, and the third OSL is an n-type OSL.

* * * * *